United States Patent
Yen et al.

(10) Patent No.: US 10,424,586 B2
(45) Date of Patent: Sep. 24, 2019

(54) MEMORY DEVICE INCLUDING A TRENCH ISOLATION STRUCTURE BETWEEN BURIED WORD LINES AND MANUFACTURING METHOD THEREOF

(71) Applicant: Winbond Electronics Corp., Taichung (TW)

(72) Inventors: Ying-Chu Yen, Taichung (TW); Wei-Che Chang, Taichung (TW); Yoshinori Tanaka, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 15/867,079

(22) Filed: Jan. 10, 2018

(65) Prior Publication Data

US 2018/0358362 A1    Dec. 13, 2018

(30) Foreign Application Priority Data

Jun. 9, 2017    (CN) .......................... 2017 1 0431435

(51) Int. Cl.
*H01L 27/108*    (2006.01)
*H01L 21/762*    (2006.01)
*H01L 29/06*    (2006.01)

(52) U.S. Cl.
CPC .. *H01L 27/10891* (2013.01); *H01L 21/76224* (2013.01); *H01L 27/10814* (2013.01); *H01L 27/10823* (2013.01); *H01L 27/10876* (2013.01); *H01L 27/10888* (2013.01); *H01L 29/0649* (2013.01)

(58) Field of Classification Search
CPC ......... H01L 27/10891; H01L 21/76224; H01L 27/10814; H01L 27/10888; H01L 29/0649
USPC .................. 257/296; 438/238, 239, 386, 399
See application file for complete search history.

(56) References Cited

U.S. PATENT DOCUMENTS

| 2013/0015551 | A1 | 1/2013 | Wang | |
| 2013/0062679 | A1* | 3/2013 | Manabe | H01L 21/743 257/306 |
| 2014/0367775 | A1 | 12/2014 | Min | |
| 2015/0340453 | A1* | 11/2015 | Cho | H01L 29/423 257/330 |

FOREIGN PATENT DOCUMENTS

TW    201442210 A    11/2014

* cited by examiner

*Primary Examiner* — Didarul A Mazumder
(74) *Attorney, Agent, or Firm* — Muncy, Geissler, Olds & Lowe, P.C.

(57) ABSTRACT

A memory device includes a semiconductor substrate having at least one active area that is defined by a device isolation structure. The memory device further includes two neighboring buried word lines disposed in the semiconductor substrate of the active area. The memory device further includes a trench isolation structure disposed in the semiconductor substrate between the buried word lines.

18 Claims, 5 Drawing Sheets

MEMORY DEVICE INCLUDING A TRENCH ISOLATION STRUCTURE BETWEEN BURIED WORD LINES AND MANUFACTURING METHOD THEREOF

CROSS REFERENCE TO RELATED APPLICATIONS

This application claims priority of Chinese Patent Application No. 201710431435.5, filed on Jun. 9, 2017, the entirety of which is incorporated by reference herein.

BACKGROUND

Field of the Disclosure

The disclosure relates to a semiconductor technology, and in particular to a memory device and the manufacturing method thereof that are capable of suppressing the row hammer effect.

DESCRIPTION OF THE RELATED ART

A semiconductor memory device includes memory cells for storage of data. Those memory cells are typically arranged in a matrix of rows and columns. One example of the various types of semiconductor memory devices is the dynamic random access memory (DRAM) device. As DRAM technology advances, the memory cells in the DRAM device are scaled down, so as to increase the density (or integration degree) of the memory cells. The increase in the density of the memory cells increases the storage capacity of the DRAM device.

However, as the density of the memory cells increases, the gap between two neighboring word lines decreases. As a result, the narrowing of the gap increases the coupling effect between neighboring word lines. For example, when a row (word line) in the memory matrix is repeatedly activated and refreshed, noise can be injected into the neighboring row (called a victim row), so that data corruption is caused in one or more memory cells in the victim row. Such repeated activation and refreshing of the row are typically referred to as the row hammer effect.

Thus, there exists a need in the art for development of a novel memory device and a manufacturing method thereof capable of mitigating or eliminating the aforementioned problems.

SUMMARY

An exemplary embodiment of a memory device is provided. The memory device includes a semiconductor substrate having at least one active area that is defined by a device isolation structure. Two neighboring buried word lines are disposed in the semiconductor substrate of the active area. A trench isolation structure is disposed in the semiconductor substrate between the buried word lines.

Another exemplary embodiment of a method for manufacturing a memory device is provided. The method includes forming a first masking pattern layer on a semiconductor substrate. The semiconductor substrate has at least one active area that is defined by a device isolation structure. The semiconductor substrate is etched using the first masking pattern layer as an etch mask, so as to form two neighboring first trenches in the semiconductor substrate of the active area. Two neighboring buried word lines are formed in the neighboring first trenches. An insulating cap layer is formed on the first masking pattern layer. The insulating cap layer fills the neighboring first trenches and on the neighboring buried word lines. The insulating cap layer, the first masking pattern layer, and the semiconductor substrate are patterned, so as to form a second trench in the semiconductor substrate between the neighboring buried word lines and a third trench in the insulating cap layer above the second trench. A width of the third trench is greater than a width of the second trench. The second trench is filled with an insulating material, so as to form a trench isolation structure.

BRIEF DESCRIPTION OF THE DRAWINGS

The present disclosure can be further understood by reading the subsequent detailed description and examples with references made to the accompanying drawings, wherein.

DETAILED DESCRIPTION

Figure 1A:
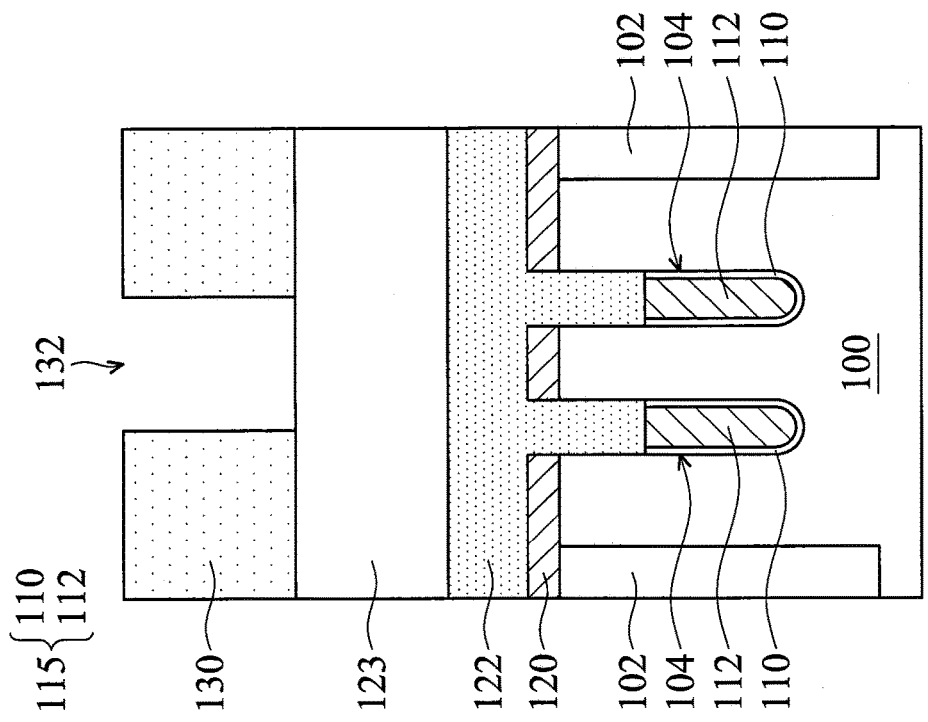
FIGS. 1A to 1I are cross-sectional views of various intermediate stages for forming a memory device according to some embodiments of the present invention.

The following description is of the best-contemplated mode of carrying out the invention. This description is provided for the purpose of illustrating the general principles of the invention and should not be taken in a limiting sense. The scope of the invention is best determined by reference to the appended claims. Moreover, the same or similar elements in the drawings and the description are labeled with the same reference numbers.

Figure 1B:
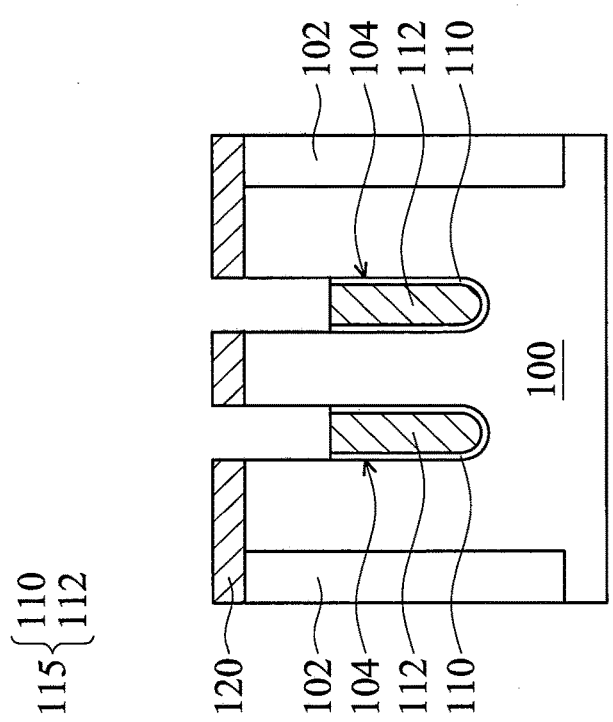
Figures 1C, 1D:
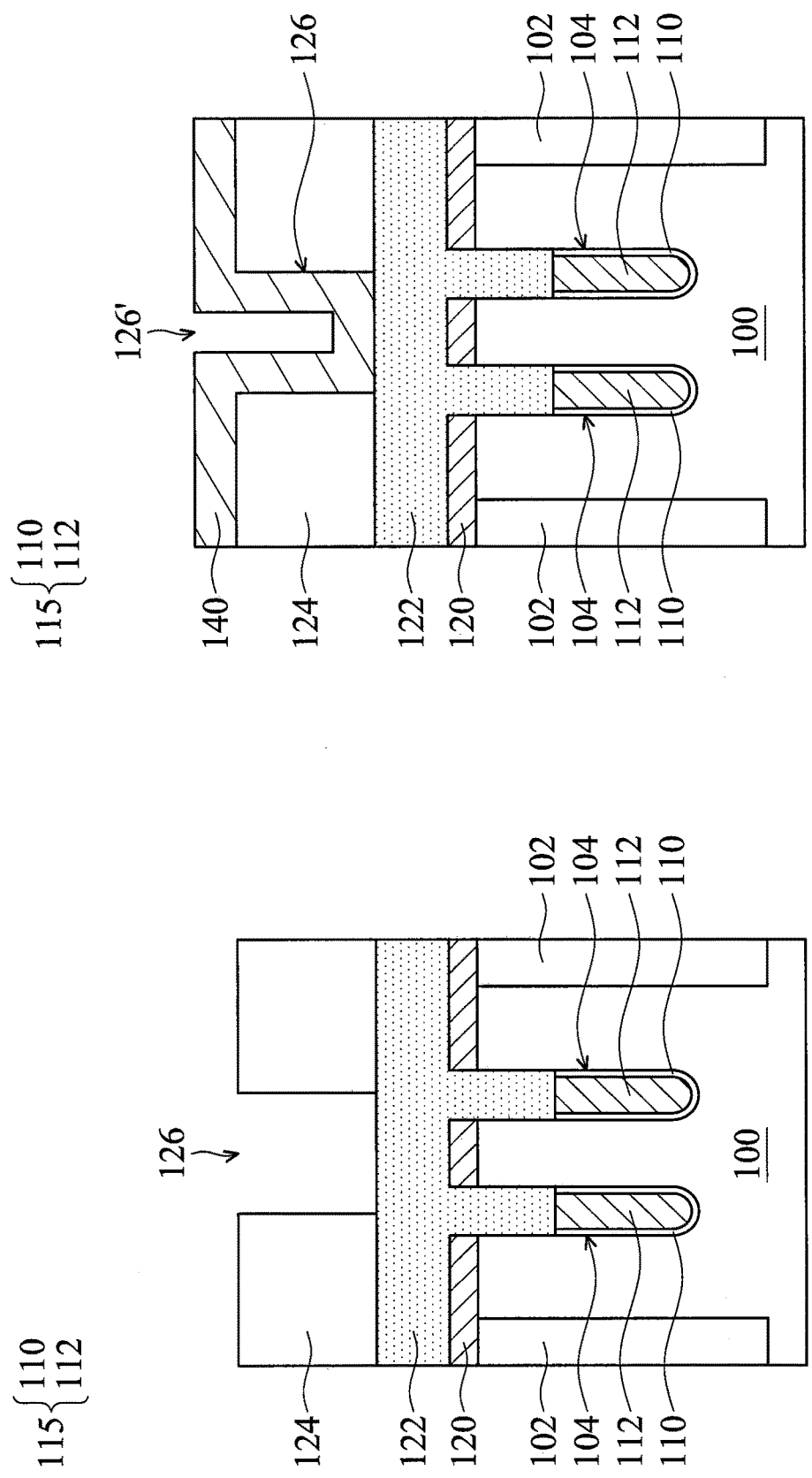
Figure 1F:
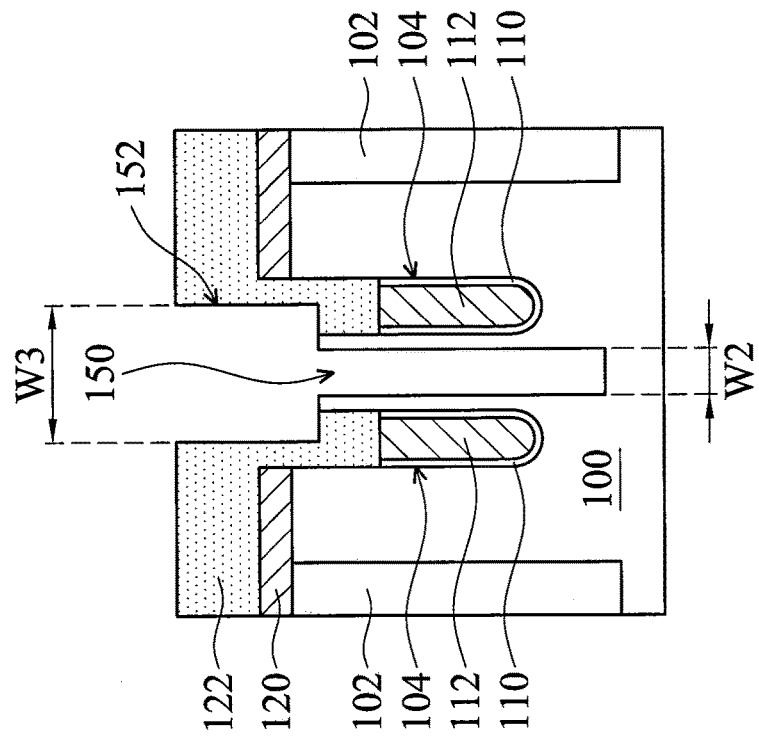
Figure 1E:
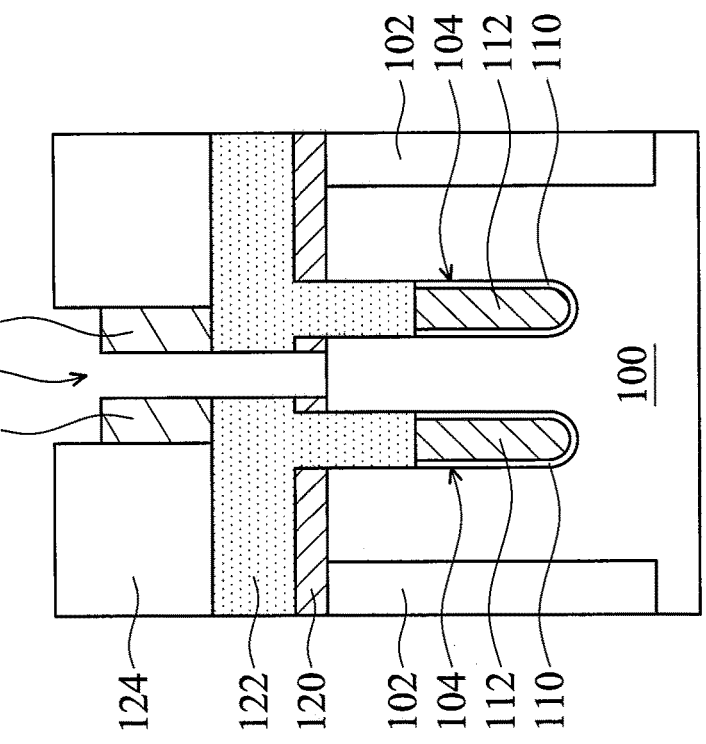
Figure 1G:
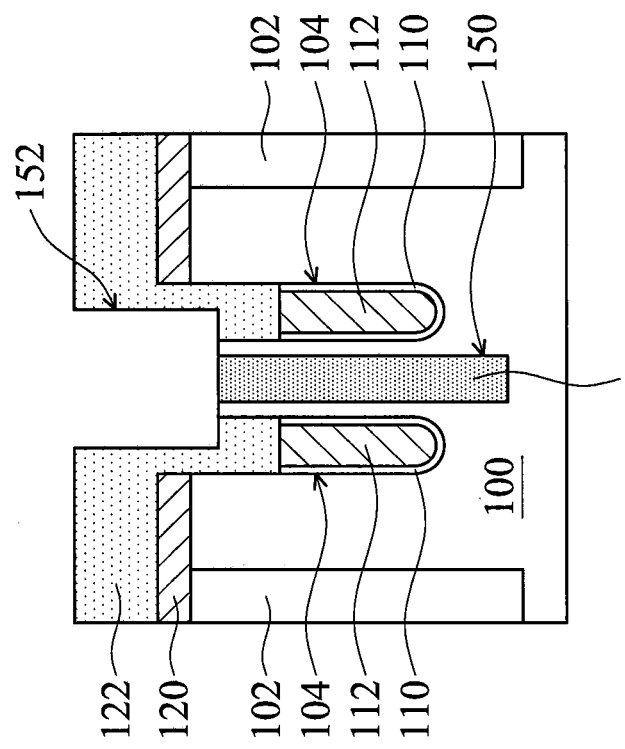
Figure 1H:
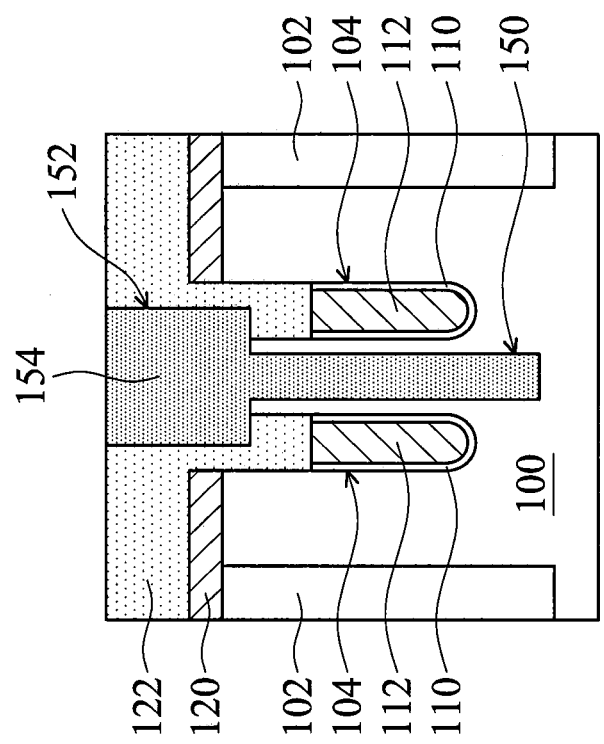
Figure 1I:
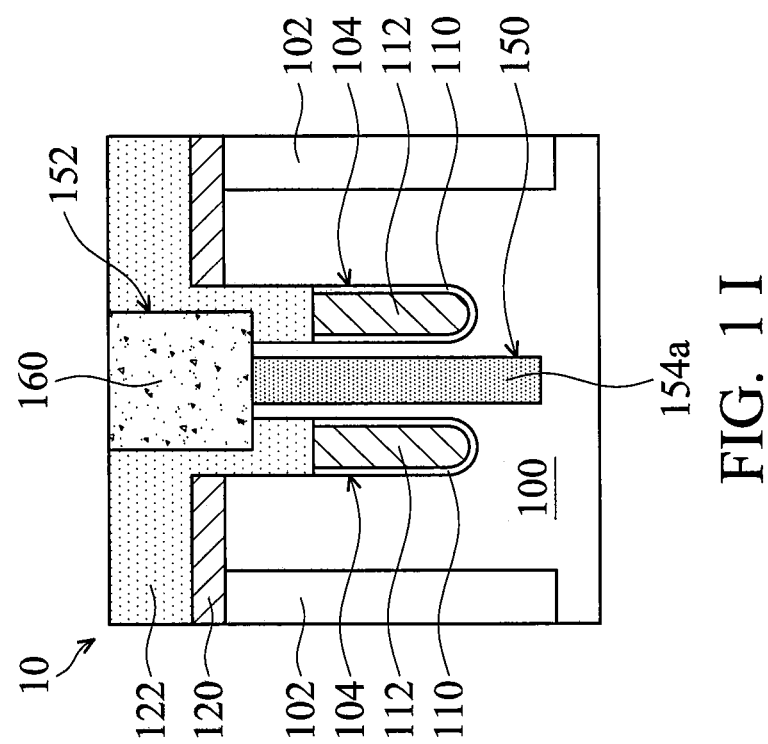

Refer to FIG. 1I, which illustrates a cross-sectional view of a memory device 10 according to some embodiments of the present invention. In some embodiments, the memory device 10 includes a semiconductor substrate 100. The semiconductor substrate 100 may be a bulk silicon substrate. Alternatively, the semiconductor substrate 100 may include an elementary semiconductor material, a compound semiconductor material, or a combination thereof. The semiconductor substrate 100 may also be a silicon-on-insulator (SOI) substrate.

In some embodiments, the semiconductor substrate 100 has at least one active area that is defined by a device isolation structure 102, so that the neighboring devices (e.g., memory cells) are electrically isolated from each other. In some embodiments, the device isolation structure 102 includes a dielectric material, such as silicon oxide, silicon nitride, silicon oxynitride, low-k dielectric material, or another suitable material or a combination thereof. In some embodiments, the device isolation structure 102 is formed by an isolation technology (e.g., local oxidation of semiconductor (LOCOS), trench isolation, or the like). For example, the device isolation structure 102 may be a deep trench isolation (DTI) structure that is formed by the trench isolation technology.

In some embodiments, the memory device 10 includes two neighboring buried word lines 115 that are respectively disposed in two neighboring first trenches 104 formed in the semiconductor substrate 100 of the active area. In some embodiments, those first trenches 104 are formed by etching the semiconductor substrate 100 using a first masking pattern layer 120 disposed on the semiconductor substrate 100 as an etch mask. In some embodiments, the first masking pattern layer 120 is a hard masking layer and may be formed of silicon oxide or another suitable hard masking material.

In some embodiments, the first trenches 104 have a depth that is less than that of the device isolation structure 102.

Moreover, the top of the buried word lines 115 is lower than the top of the first trenches 104. Namely, the buried word line 115 does not fully fill the first trench 104. In some embodiments, the buried word line 115 includes an insulating liner 110 and a conductive layer 112. The insulating liner 110 is interposed between the conductive layer 112 and the semiconductor substrate 100, so as to serve as a gate dielectric layer. The insulating liner 110 may include silicon oxide, silicon nitride, silicon oxynitride, low-k dielectric material, or another suitable material or a combination thereof. Moreover, the conductive layer 112 may serve as a gate and include metal or another suitable electrode material.

In some embodiments, the memory device 10 includes a trench isolation structure 154a. The trench isolation structure 154a is disposed in a second trench 150 formed in the semiconductor substrate 100 between the buried word lines 115. In some embodiments, the trench isolation structure 154a is formed of silicon oxide or another suitable insulating material. In some embodiments, the top surface of the trench isolation structure 154a is lower than that of the device isolation structure 102. Moreover, the top surface of the trench isolation structure 154a is higher than that of the buried word line 115 and the bottom surface of the trench isolation structure 154a is lower than that of the buried word line 115. In some embodiments, the trench isolation structure 154a has a depth that is in a range of about 40 nm to 70 nm and has a width that is in a range of about 80 nm to 90 nm. In some embodiments, as viewed from a top-view perspective, the length orientation of the buried word lines 115 is substantially parallel to that of the trench isolation structure 154a. For example, as viewed from a top-view perspective, both the buried word line 115 and the trench isolation structure 154a are rectangular. Moreover, the length extending directions of the buried word line 115 and the trench isolation structure 154a are substantially parallel to each other.

In some embodiments, the memory device 10 includes an insulating cap layer 122. The insulating cap layer 122 is disposed over the semiconductor substrate 100 and fills the first trenches 104 to cover the buried word lines 115. In some embodiments, the insulating cap layer 122 provides protection of the buried word lines 115 and is formed of silicon nitride or another suitable insulating material. In some embodiments, the insulating cap layer 122 has a third trench 153 therein and above the second trench 150 of the semiconductor substrate 100. Moreover, the trench isolation structure 154a is exposed from the bottom of the third trench 152.

In some embodiments, the memory device 10 includes a bit line contact electrode 160. The bit line contact electrode 160 is disposed in the third trench 152, so that the bit line contact electrode 160 is in the insulating cap layer 122 between the buried word lines 115. The bit line contact electrode 160 may serve as a common source electrode for the buried word lines 115. In some embodiments, the bottom surface of a portion of the bit line contact electrode 160 is in contact with the trench isolation structure 154a and another portion of the bit line contact electrode 160 is directly above the buried word lines 115. Since the top surface of the trench isolation structure 154a is higher than that of the buried word lines 115, the bit line contact electrode 160 is not in electrical contact with the buried word line 115. In some embodiments, the bit line contact electrode 160 is formed of polysilicon or another suitable electrode material. For example, the bit line contact electrode 160 may be polysilicon layer containing n-type dopants.

FIGS. 1A to 1I are cross-sectional views of various intermediate stages for forming a memory device according to some embodiments of the present invention. Refer to FIG. 1A; a semiconductor substrate 100 is provided. The semiconductor substrate 100 may be a bulk silicon substrate or an SOI substrate. The semiconductor substrate 100 may also be a doped substrate (e.g., doped with p-type or n-type dopants) or an undoped substrate. In some embodiments, the semiconductor substrate 100 may be formed of a semiconductor material including, for example, silicon, germanium, compound semiconductor, alloy semiconductor, or a combination thereof.

In some embodiments, the device isolation structure 102 is formed in the semiconductor substrate 100 using an isolation technology (e.g., LOCOS, trench isolation, or the like), so as to define at least one active area. For example, the device isolation structure 102 may be a DTI structure and the formation thereof includes etching a trench in the semiconductor substrate 100 and followed by filling the trench with an insulating material, such as silicon oxide, silicon nitride, silicon oxynitride, low-k dielectric material, or another suitable material or a combination thereof. Afterwards, a chemical mechanical polishing (CMP) process may be performed, so as to remove the excess insulating material is removed and planarize the top surface of the device isolation structure 102.

Thereafter, a first masking pattern layer 120 is formed on the semiconductor substrate 100 by a conventional deposition process (e.g., chemical vapor deposition (CVD) or spin-on coating), a lithography process, and an etching process (e.g., dry etching or wet etching). The semiconductor substrate 100 is subsequently etched using the first masking pattern layer 120 as an etch mask, so as to form two neighboring first trenches 104 in the semiconductor substrate 100 of the active area. In some embodiments, the first trench 104 has a depth that is less than the depth of the device isolation structure 102.

Afterwards, a buried word line 115 is formed in each of the first trenches 104. The top of the buried word line 115 is lower than the top of the first trench 104. For example, an insulating liner 110 is formed in each of the first trenches 104. The insulating liner 110 may include silicon oxide, silicon nitride, silicon oxynitride, low-k dielectric material, or another suitable material or a combination thereof. Moreover, the insulating liner 110 may be formed by a CVD process or a thermal oxidation process. After the insulating liners 110 are formed, a conductive layer 112 (e.g., metal) is formed in each of the first trenches 104. The conductive layer 112 may be formed by a physical vapor deposition (PVD) process, a CVD process, or another suitable process. After the conductive layers 112 are formed, the conductive layers 112 and the insulating liner 110 are successively etched back, so that the conductive layers 112 and the insulating liner 110 do not fully fill the first trenches 104. In some embodiments, the insulating line 110 and the conductive layer 112 constitute the buried word line 115, in which the insulating line 110 may serve as a gate dielectric layer and the conductive layer 112 serve as a gate.

Refer to FIGS. 1B and 1C, which illustrate the formation of an insulating cap layer 122 and a second masking pattern layer 124. As shown in FIG. 1B, an insulating cap layer 122 is formed on the first masking pattern layer 120 and fills the first trenches 104 above the buried word lines 115. In some embodiments, the insulating cap layer 122 is formed of silicon nitride or another suitable insulating material. Moreover, the insulating cap layer 122 may be formed by a CVD process or a spin-on coating process.

Afterwards, a hard masking layer 123 and a photoresist pattern layer 130 may be successively formed on the insulating cap layer 122. In some embodiments, the hard masking layer 123 is formed of polysilicon and formed by a CVD process or another suitable process. Moreover, the photoresist pattern layer 130 is formed by a conventional lithography process. In some embodiments, the photoresist pattern layer 130 has an opening 132 above the semiconductor substrate 100 between the buried word lines 115. In some embodiments, the opening 132 has a width that is in a range of about 60 nm to 80 nm.

Afterwards, the hard masking layer 123 below the opening 132 is removed by an etching process, so as to transfer the opening pattern of the photoresist pattern layer 130 into the hard masking layer 123. As a result, a second masking pattern layer 124 having an opening 126 therein is formed. The opening 126 exposes the portion of the insulating cap layer 122 between buried word lines 115. As shown in FIG. 1C, the photoresist pattern layer 130 is subsequently removed by a stripping process (e.g., an ashing process) and a cleaning process.

Refer to FIG. 1D; an insulating layer 124 is conformally formed on the second masking pattern layer 124 and the sidewall and bottom of the opening 126. In some embodiments, the insulating layer 140 forms a recess 126' in the opening 126. It should be understood that the desired width of the recess 126' can be obtained by controlling the thickness of the insulating layer 140. In some embodiments, the insulating layer 140 is formed of a material that is the same as that of the insulating cap layer 122. For example, both the insulating cap layer 122 and the insulating layer 140 may be formed of silicon nitride. In some embodiments, the insulating layer 140 is formed of a material that is different from that of the insulating cap layer 122.

Refer to FIG. 1E; in some embodiments, an anisotropic etching process is performed on the insulating layer 140, so as to remove the insulating layer 140 on the second masking pattern layer 124 and in the bottom of the opening 126. As a result, an insulating spacer 142 is formed in the opening 126 and exposes the insulating cap layer 122. Afterwards, the insulating spacer 142, the exposed insulating cap layer 122, and the first masking pattern layer 120 below the exposed insulating cap layer 122 are etched back. As a result, the top of the insulating spacer 142 is lower than the top surface of the second masking pattern layer 124, so that the opening 126 has a T-shaped profile and exposes the semiconductor substrate 100.

Refer to FIG. 1F; an etching process may be performed to transfer the T-shaped pattern of the opening 126 into the layers below the opening 126. After the etching process is performed, the second masking pattern layer 124 and the insulating spacer 142 are entirely removed. Moreover, the insulating cap layer 122, the first masking pattern layer 120, and the semiconductor substrate 100 are patterned, so as to form a second trench 150 in the semiconductor substrate 100 between the buried word lines 115 and a third trench 152 in the insulating cap layer 122 above the second trench 150. The bottom of the second trench 150 is lower than the bottoms of the buried word lines 115. Moreover, the third trench 152 extends into the semiconductor substrate 100, so that the top of the second trench 150 is lower than the top surface of the device isolation structure 102. Moreover, the width W3 of the third trench 152 is greater than the width W2 of the second trench 150.

Refer to FIG. 1G; an insulating material 154 is formed on the insulating cap layer 122 and fills the second trench 150 and the third trench 152. In some embodiments, the insulating material 154 may include silicon oxide or another suitable insulating material. Moreover, the insulating material 154 may be formed by a CVD process or a spin-on coating process. Afterwards, a CMP process may be performed to remove the excess insulating material 154 on the insulating cap layer 122.

Refer to FIG. 1H; after performing the CMP process, the portion of the insulating material 154 in the third trench 152 is removed, and thereby the portion of the insulating material 154 in the second trench 150 remains to form a trench isolation structure 154a. As a result, the top surface of the trench isolation structure 154a is lower than the top surface of the device isolation structure 102. Moreover, the bottom surface of the trench isolation structure 154a is lower than the bottom surface of the buried word lines 115. In some embodiments, the trench isolation structure 154a has a depth that is in a range of about 40 nm to 70 nm and has a width that is in a range of about 80 nm to 90 nm. In some embodiments, as viewed from a top-view perspective, the length orientation of the buried word lines 115 is substantially parallel to that of the trench isolation structure 154a. For example, as viewed from a top-view perspective, both the buried word line 115 and the trench isolation structure 154a are rectangular. Moreover, the length extending directions of the buried word line 115 and the trench isolation structure 154a are substantially parallel to each other.

Refer to FIG. 1I; a conductive material (not shown) is formed on the insulating cap layer 122 and fills the third trench 152. In some embodiments, the conductive material includes metal or another suitable conductive material. Moreover, the conductive material may formed by a PVD process, a CVD process, or another suitable process. Afterwards, a CMP process may be performed to remove the excess conductive material on the insulating cap layer 122, thereby forming a bit line contact electrode 160 in the third trench 152. The bottom surface of the bit line contact electrode 160 is in contact with the trench isolation structure 154a. A capacitor contact electrode (not shown) and a capacitor device (not shown) may be subsequently and successively formed in and/or on the structure shown in FIG. 1I by a conventional process. As a result, the fabrication of the memory device 10 is completed.

According to the foregoing embodiments, since there is a trench isolation structure formed between the neighboring buried word lines, one row (word line) of the memory matrix may block noise or disturbance from the neighboring row (word line) via the trench isolation structure, thereby suppressing or mitigating the row hammer effect. Moreover, the same photomask (e.g., the photomask used for definition of the bit line contact electrode) is used for performing the lithography process, thereby simultaneously forming the second trench for placement of the trench isolation structure and the third trench for placement of the bit line contact electrode in subsequent etching process. As a result, the trench isolation structure can be formed without providing an additional photomask and forming an additional etch mask for definition of the second trench. Additionally, if the trench isolation structure adjacent to the buried word line is formed when the active area is defined, the size of the active area is greatly reduced, thereby significantly increasing the difficulty of the process. According to the foregoing embodiments, however, since the trench isolation structure is formed using the photomask for definition of the bit line contact electrode, a half size of active area can be defined without changing the photomask used for definition of the active area.

While the disclosure has been described by way of example and in terms of the preferred embodiments, it should be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A memory device, comprising:
   a semiconductor substrate having at least one active area that is defined by a device isolation structure;
   two neighboring buried word lines disposed in the semiconductor substrate of the active area;
   a trench isolation structure disposed in the semiconductor substrate between the two neighboring buried word lines; and
   a bit line contact electrode disposed over the two neighboring buried word lines, wherein a width of the bit line contact electrode is greater than a spacing between the two neighboring buried word lines, wherein a bottom surface of the bit line contact electrode includes a first portion in contact with the trench isolation structure, a second portion in contact with the semiconductor substrate, and a third portion directly above the two neighboring buried word lines.

2. The memory device as claimed in claim 1, wherein the trench isolation structure comprises silicon oxide.

3. The memory device as claimed in claim 1, wherein a top surface of the trench isolation structure is lower than a top surface of the device isolation structure.

4. The memory device as claimed in claim 1, wherein a bottom surface of the trench isolation structure is lower than bottom surfaces of the two neighboring buried word lines.

5. The memory device as claimed in claim 1, further comprising:
   an insulating cap layer disposed over the semiconductor substrate and covering the two neighboring buried word lines, wherein
   the bit line contact electrode disposed in the insulating cap layer between the two neighboring buried word lines.

6. The memory device as claimed in claim 5, wherein the bit line contact electrode comprises polysilicon.

7. The memory device as claimed in claim 1, wherein a length orientation of the two neighboring buried word lines is substantially parallel to a length orientation of the trench isolation structure, as viewed from a cross-sectional view perspective.

8. The memory device as claimed in claim 1, wherein a width of the trench isolation structure is less than a width of the device isolation structure.

9. The memory device as claimed in claim 1, wherein each of the two neighboring buried word lines comprises:
   a conductive layer; and
   an insulating liner interposed between the conductive layer and the semiconductor substrate, wherein a top surface of the insulating liner is coplanar with a top surface of the conductive layer.

10. A method for manufacturing a memory device, comprising:
    forming a first masking pattern layer on a semiconductor substrate, wherein the semiconductor substrate has at least one active area that is defined by a device isolation structure;
    etching the semiconductor substrate using the first masking pattern layer as an etch mask, so as to form two neighboring first trenches in the semiconductor substrate of the active area;
    forming two neighboring buried word lines in the two neighboring first trenches;
    forming an insulating cap layer on the first masking pattern layer, wherein the insulating cap layer fills the two neighboring first trenches and on the two neighboring buried word lines;
    patterning the insulating cap layer, the first masking pattern layer, and the semiconductor substrate, so as to form a second trench in the semiconductor substrate between the two neighboring buried word lines and a third trench in the insulating cap layer above the second trench, wherein a width of the third trench is greater than a width of the second trench;
    filling the second trench with an insulating material, so as to form a trench isolation structure; and
    filling the third trench with a conductive material, so as to form a bit line contact electrode, wherein the bit line contact electrode disposed over the two neighboring buried word lines, wherein a width of the bit line contact electrode is greater than a spacing between the two neighboring buried word lines, wherein a bottom surface of the bit line contact electrode includes a first portion in contact with the trench isolation structure, a second portion in contact with the semiconductor substrate, and a third portion directly above the two neighboring buried word lines.

11. The method as claimed in claim 10, wherein before patterning the insulating cap layer, the first masking pattern layer, and the semiconductor substrate, the method further comprises:
    forming a second masking pattern layer on the insulating cap layer, wherein the second masking pattern layer has an opening exposing the insulating cap layer above and between the two neighboring word lines; and
    forming an insulating spacer in the opening, wherein a top of the insulating spacer is lower than a top surface of the second masking pattern layer, so that the opening has a T-shaped profile.

12. The method as claimed in claim 11, wherein the second masking pattern layer comprises polysilicon.

13. The method as claimed in claim 11, wherein the insulating cap layer and the insulating spacer comprise silicon nitride.

14. The method as claimed in claim 10, wherein the insulating material comprises silicon oxide.

15. The method as claimed in claim 10, wherein a top surface of the trench isolation structure is lower than a top surface of the device isolation structure.

16. The method as claimed in claim 10, wherein a bottom surface of the trench isolation structure is lower than bottom surfaces of the two neighboring buried word lines.

17. The method as claimed in claim 10, wherein the direction of a length orientation of the two neighboring buried word lines is substantially parallel to a length orientation of the trench isolation structure, as viewed from a cross-sectional view perspective.

18. The method as claimed in claim 10, wherein the forming of each of the two neighboring buried word lines comprises:
    forming a conductive layer; and
    forming an insulating liner interposed between the conductive layer and the semiconductor substrate, wherein a top surface of the insulating liner is coplanar with a top surface of the conductive layer.

* * * * *